United States Patent [19]
Nishimura et al.

[11] Patent Number: 5,743,965
[45] Date of Patent: Apr. 28, 1998

[54] DISK COATING SYSTEM

[75] Inventors: Hironobu Nishimura, Tokorozawa; Yoshihiko Naito, Nerima; Naozumi Mizutani, Toride; Masahiko Kotoyori, Setagaya; Katumi Yamaguchi, Bunkyo, all of Japan

[73] Assignee: Origin Electric Company, Limited, Tokyo, Japan

[21] Appl. No.: 641,791

[22] Filed: May 2, 1996

[30] Foreign Application Priority Data

Aug. 30, 1995 [JP] Japan ................... 7-245477

[51] Int. Cl.⁶ ........................................ B05C 5/00
[52] U.S. Cl. ................ 118/712; 118/52; 118/319; 118/32; 118/620; 118/641; 414/217; 414/222; 414/935; 414/939; 901/43; 901/44
[58] Field of Search ............... 118/52, 319, 321, 118/66, 620, 641, 712; 414/217, 222, 935, 939; 901/43, 44

[56] References Cited

U.S. PATENT DOCUMENTS

| | | |
|---|---|---|
| 4,244,318 | 1/1981 | Chen . |
| 4,280,689 | 7/1981 | Lombardi . |
| 4,587,139 | 5/1986 | Hagan et al. . |
| 4,722,298 | 2/1988 | Rubin et al. ............... 414/939 |
| 4,822,639 | 4/1989 | Fujii et al. . |
| 4,981,074 | 1/1991 | Machita et al. . |
| 5,180,431 | 1/1993 | Sugimoto et al. . |
| 5,211,753 | 5/1993 | Swain . |
| 5,234,499 | 8/1993 | Sasaki et al. . |
| 5,238,713 | 8/1993 | Sago et al. . |
| 5,242,496 | 9/1993 | Handy . |
| 5,310,410 | 5/1994 | Begin et al. ............... 414/217 |
| 5,326,398 | 7/1994 | Kelley et al. . |
| 5,403,397 | 4/1995 | Beckers et al. ............ 118/52 |
| 5,451,130 | 9/1995 | Kemp ........................ 414/217 |

FOREIGN PATENT DOCUMENTS

| | | |
|---|---|---|
| 37 17 610 A | 3/1988 | Germany . |
| 6-139624 | 5/1994 | Japan . |
| 6-282885 | 10/1994 | Japan . |

OTHER PUBLICATIONS

Patent Abstracts of Japan, Kotoyori Masahiko et al., JP 6282885 A, Oct. 10, 1994, "Apparatus aand Method for Forming Film for Disk".

*Primary Examiner*—Laura Edwards
*Attorney, Agent, or Firm*—Lowe, Price, LeBlanc & Becker

[57] ABSTRACT

To improve the reliability, operating speed, size of equipment and economy, a disk coating system for forming a coating on a disk such as a compact disk is arranged to transfer disks to and from a pair of spinners with first and second disk transfer mechanisms. The coating system further has an intermittently rotating turntable, an apparatus for supplying a coating material to each disk on the turntable at a predetermined position, and a system for curing a coating layer on each disk. The spinners for removing an excess amount of the coating material are placed between the turntable and the curing system. The first transfer mechanism is for transferring disks from the turntable to the spinners, and the second transfer mechanism is for transferring disks from the spinners to the curing system. The two spinners are substantially equidistant from a predetermined disk position on the turntable. The first transfer mechanism has two arms extending in two directions diverging from a pivot at a predetermined angle. With both arms, this transfer mechanism can transfer disks from the predetermined disk position on the turntable alternately to the first and second spinners at a high speed.

17 Claims, 5 Drawing Sheets

DISK COATING SYSTEM

BACKGROUND OF THE INVENTION

The present invention relates to a disk coating system for forming a film such as a recording film or a protective film on a disk.

The compact disk is now one of the most important recording media, and widely used as an audio disk or a compact disk read only memory. The production process for the compact disk is composed mainly of an injection molding step for forming a synthetic resin disk on which information is recorded in the form of pits, a reflective film coating step for forming a reflective layer by depositing aluminum on the disk, a protective film coating step for forming a protective layer on the reflective layer, and an inspection step for inspecting the disk.

Figure 5:
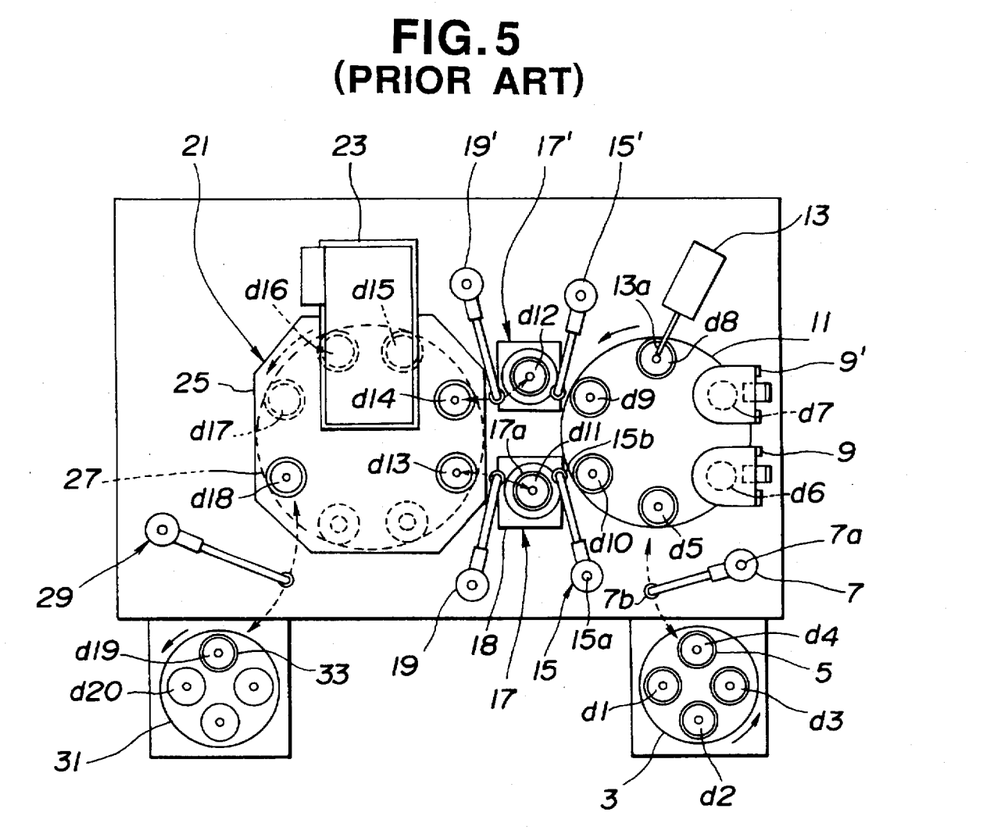
FIG. 5 is a plan view showing a conventional disk coating system.

FIG. 5 shows a conventional coating system 1, as disclosed in Japanese Patent Provisional Publication No. 6-282885, for forming coating layers on compact disks or optical disks.

A first turntable 3 shown in FIG. 5 is for supplying disks d one after another continuously. The first turntable 3 of this example can rotate a stack of disks through four disk positions d1–d4 arranged in a circle.

Figure 6:
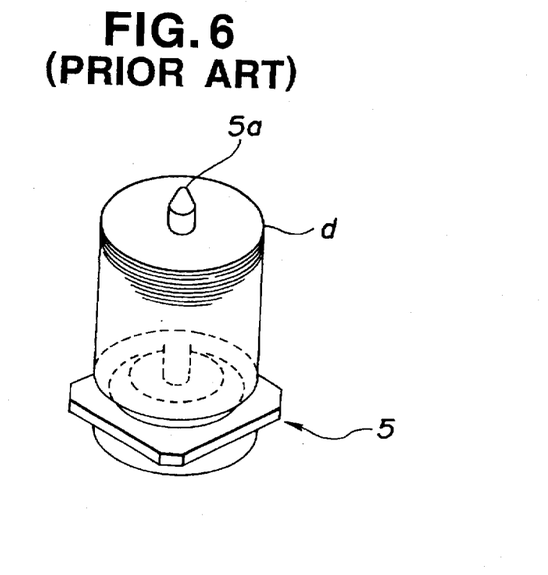
FIG. 6 is a perspective view showing a stack pole unit for storing disks, used in the conventional disk coating system of FIG. 5.

Stack pole units 5 are regularly arranged in a circle and mounted on the turntable 3. In this example, four of the stack pole units 5 are regularly arranged in a circle so that an angular distance between any two adjacent stack poles 5 is 90°. One of the stack pole units 5 is shown in FIG. 6. About 100 disks d to be coated are stacked on a pole 5a.

A disk transfer mechanism 7 has a single disk transfer arm swingable on a swing axis 7a. The transfer arm first lifts one disk d upward with a suction pad (or chuck) 7b at the end of the transfer arm, and then rotates the disk d about the swing axis 7a to a predetermined position, and finally moves the disk d downward at the predetermined position.

A second turntable 11 has six disk seats each for supporting a disk, and rotates in the counterclockwise direction as viewed in FIG. 5. The six disk seats are regularly arranged in a circle. The second turntable 11 can hold a disk resting in one of the six disk seats at one of six disk positions d5–d10 which are regularly arranged in a circle.

Cleaners 9 and 9' are for removing dust from disks. Dust attached to a disk surface is cleared away by using an air blower blowing clean gas which is charged to neutralize an electrostatic force.

A coating material supplying apparatus 13 has a coating material supplying nozzle 13a and a drive mechanism for transmitting rotation. When the turntable 11 stops at an angular position to hold one disk d at the disk position d8 for supplying a coating material, this coating system immediately starts rotating either the disk d or the supplying nozzle 13a about the axis of the disk d at the coating material supplying position d8. When this rotation reaches an almost constant state, the coating material is supplied from the nozzle 13a, and an annular, ring-shaped liquid thick film is formed on the disk surface.

A disk transfer mechanism 15 has a single transfer arm swingable on a swing axis 15a. The transfer arm lifts one disk d up with a suction pad 15b provided at the end of the transfer arm, then swings on the axis 15a to bring the disk d to a predetermined position, and finally lowers the disk d at the predetermined position.

Disk transfer mechanisms 15', 19 and 19' are constructed in the same manner as the disk transfer mechanism 15. These four disk transfer mechanisms 15, 15', 19 and 19' have respective individual drive units so that the arm of each transfer mechanism is moved by a unique one of the drive units.

A pair of spinners 17 and 17' is provided between the pair of the transfer mechanisms 15 and 15' and the pair of the transfer mechanisms 19 and 19'. The spinner 17 comprises a spin portion on which one disk is placed, a spindle unit 17a for rotating the spin portion at high speeds, and a coater house 18 for catching splashes of the coating material. The other spinner 17' has the same construction.

A curing section 21 is arranged to cure a coating layer on a disk by ultraviolet radiation. The curing section 21 comprises an ultraviolet irradiating unit 23, a shade cover 25 for preventing the escape of radiation, and a disk carrying turntable 27 enclosed in the shade cover 25.

A disk transfer mechanism 29, a turntable 31 and stack poles 33 are similar to the transfer mechanism 7, the turntable 3 and the stack poles 5, respectively.

This coating system is operated as follows: The turntable 3 on the disk supply side rotates intermittently and coveys each stack of disks from one disk position to the next in the sequence of d1→d2→d3→d4. From the position d4, the disk transfer mechanism 7 transfers each disk of a stack to the disk position d5, and loads the disk on the turntable 11. Then, the turntable 11 rotates through 1/6 of 360° in the counterclockwise direction in FIG. 5. In synchronization with this angular movement of the turntable 11, the disk transfer mechanism 7 transfer the next disk to the position d5 and loads the next disk on the turntable 11. In this way, disks d are loaded on the turntable 11 sequentially.

Each disk on the turntable 11 is cleaned twice at the positions d6 and d7 by the cleaners 9 and 9' blowing off dust. Thereafter, the turntable 11 conveys each disk to the coating material supplying position d8, and upon the arrival of the disk at the position d8, the nozzle of the coating material supplier 13 starts rotating in a speed range of 40 rpm–120 rpm and forms a ring of the coating material by supplying the coating material when a constant speed condition is reached. When two consecutive disks reach the positions d9 and d10, respectively, by two cycles of the angular movement of the turntable 11 (through 120°=60°×2), the disk transfer mechanism 15 transfers the preceding disk from the position d10 to a spin position d11 in the first spinner 17. Approximately at the same time, the disk transfer mechanism 15' transfers the following disk from the position d9 to a spin position d12 in the second spinner 17'. Each spinner 17 or 17' spins off an excess amount of the coating material by a centrifugal force at a rotational speed of about 3000–4000 rpm, and forms a coating layer of a uniform thickness.

Then, the disk transfer mechanism 19 transfers one of the disks from the spin position d11 of the spinner 17 to a disk position d13 on the turntable 27. Similarly, the disk transfer mechanism 19' transfers the other disk from the spin position d12 to a disk position 14 on the turntable 27. The disk transfer mechanisms 15 and 15' supply new disks to the spinners 17 and 17' by repeating the disk transfer operations in synchronization with the operations of the disk transfer mechanism 19 and 19'. The centers of the positions d10 and d11 lie on a circular arc along which the suction pad 15b of the transfer mechanism 15 swings. Similarly, the centers of the positions d9 and d12 lie on a circular arc described by the suction pad of the transfer mechanism 15'. The centers of the positions d11 and d13 lie on a circular arc described by the suction pad of the disk transfer mechanism 19, and the centers of the positions d12 and d14 lies on a circular arc of the suction pad of the transfer mechanism 19'.

The turntable 27 in the curing system 21 turns in the counterclockwise direction in FIG. 5, and conveys each disk through positions d15 and d16. During the travel from the position d15 to the position d16, the liquid coating on each disk is cured due to the chemical effect of ultraviolet radiation from the irradiation unit 23. After the curing operation, the turntable 25 conveys each disk through a position d17 to a position d18, and the disk transfer mechanism 29 transfers each disk from the position d18 to a disk position d19 with a suction unit, and mounts each disk on one of the stack pole units 33 on the turntable 31 at the disk position d19. When the stack pole unit 33 at the disk position d19 becomes full, the turntable 31 rotates in the counterclockwise direction in FIG. 5 to shift the full stack pole unit 33 to a position d20 and instead shifts an empty stack pole to the position d19.

SUMMARY OF THE INVENTION

This conventional coating system is problematic in the following points, however.

There is a significant difference between the time required for a disk to travel from the coating material supplying position d8 to the spin position d11 in the first spinner 17, and the time of travel of a disk from the coating material supplying position d8 to the spin position d12 of the second spinner 17'. This difference tends to cause undesirable nonuniformity disk to disk in the quality of coating For the two spinners 17 and 17', there are provided four of the single arm disk transfer mechanisms. This arrangement requires four drive units for the four transfer mechanisms, and hence increases the overall size and cost of the system.

The coating material supplying system 13 starts rotating the nozzle 13A after a disk is settled at the supply position d8. Accordingly, the supply of the coating material can not be started until the rotational speed of the nozzle 13A reaches a predetermined constant speed of about 40 rpm–120 rpm. This significantly increases the operating time.

When disks are stacked with back sides upward for protection against dust, an disk inverting mechanism must be provided on the disk supply side.

An information disk is often used for indicating the contents of disks on a stack pole and data items about a lot to facilitate the production management. The information disk is placed on the top of the disk stack of the stack pole, and the coating operation must not be performed to the information disk. Therefore, the conventional coating system requires troublesome manual operations by a human operator to remove the information disk from a stack of ordinary disks beforehand, and place the information disk again on the top of the stack of the ordinary disks after the coating operation of the ordinary disks.

After an exchange of stampers for the injection molding system to change the contents of disks, disks are produced as a test by the injection molding system and theses disks are supplied as sample disks to the production line to determine whether the product is acceptable. The conventional system is not efficient in handling these sample disks. The supply of ordinary disks from a stack pole unit in the production line is interrupted, and stack pole units for sample disks are installed on both of the disk supply side, and the disk discharge side. These operations increase the production time.

Under the influence of an upstream production step, disks are often in such a state that two or more disks tend to adhere to one another. Accordingly, a transfer mechanism may lift up two or more disks together by suction, and supply the superposed disks to a next production step instead of supplying one by one. To prevent this, the conventional system has a sensor, such as a photoelectric type sensor, for monitoring a disk thickness at the periphery of a disk from the outside. However, the periphery of a disk is most easily influenced by warp and inclination of the disk, and therefore, the adjustment of the sensor is very difficult. The sensitivity of the sensor must be made high enough as long as priority is given to safety, and the high sensitivity sensor tends to stop the system by misjudging a disk placed just slopingly to be an overlap of disks, and increase the downtime.

It is therefore an object of the present invention to provide a disk coating system which is reliable, high in operating speed, small in size, and effective in cost.

DETAILED DESCRIPTION OF THE INVENTION

Figure 1:
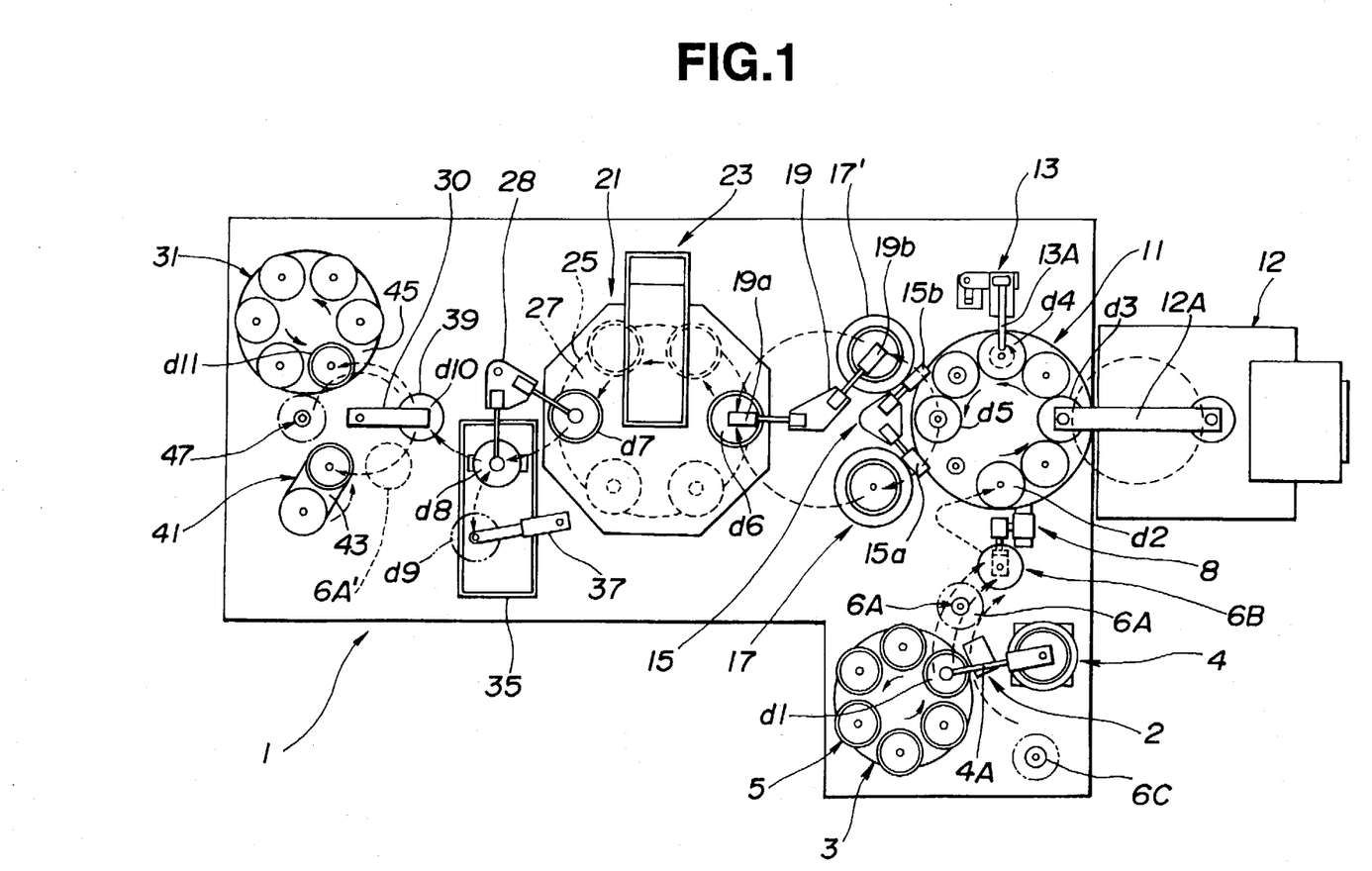
FIG. 1 is a plan view showing a disk coating system according to one embodiment of the present invention.

FIG. 1 shows a disk coating system according to one embodiment of the present invention, for forming a coating layer on a disk.

A first turntable 3 shown in FIG. 1 supports a plurality of stack pole units 5 for storing disks d. On the turntable 3, six of the stack pole units 5 are regularly arranged in a circle, so that an angular displacement between any two adjacent stack pole units 5 is about 60°. Disks d are stacked upside down on each (non-empty) stack pole unit 5. That is, each disk has a first disk surface to be coated and a second disk surface opposite to the first surface, and all the disks are put in the inverted state with the first disk surfaces facing downward and the second surface facing upward in order to protect the first disk surfaces to be coated against dust. In many cases, an information disk is placed on top of a stack of disks d. The information disk has data (printed on its surface) for production control, such as data for indicating the contents of disks to be processed and the lot number.

The stack pole units 5 are identical in construction to the stack pole unit shown in FIG. 6, and each stack pole unit 5 has a base and an upright stack pole 5a as shown in FIG. 6. Each stack pole unit 5 can support about 100 disks d with the stack pole 5a passing through the center holes of the disks d. The first turntable 3 is rotated intermittently, and holds the stack pole units 5 one after another at a predetermined disk supply position d1.

A disk lifter 2 is placed at the side of the first turntable 3, as shown in FIG. 1. Each time one disk is removed from the top of a disk stack, that is a stack of disks, at the disk supply position d1, the disk lifter 2 lifts the disk stack by an amount corresponding to the thickness of one disk, so that the height of the uppermost disk of the stack pole unit 5 at the position d1 is held constantly at a predetermined level.

When all the disks are removed from the stack pole 5 at the position d1, and the stack pole 5 becomes empty, the disk lifter 2 descends, and then the turntable 3 rotates 60 degrees in the counterclockwise direction in FIG. 1, and moves the stack pole units 5 to the respective next positions. From the new arrival at the position d1, disks are removed again one after another in the same manner. When the new arrival at the position d1 is empty, the empty stack pole unit 5 is manually replaced by a full stack pole unit 5 having a full number of disks. These operations are repeated to supply disks continuously.

Figure 2:
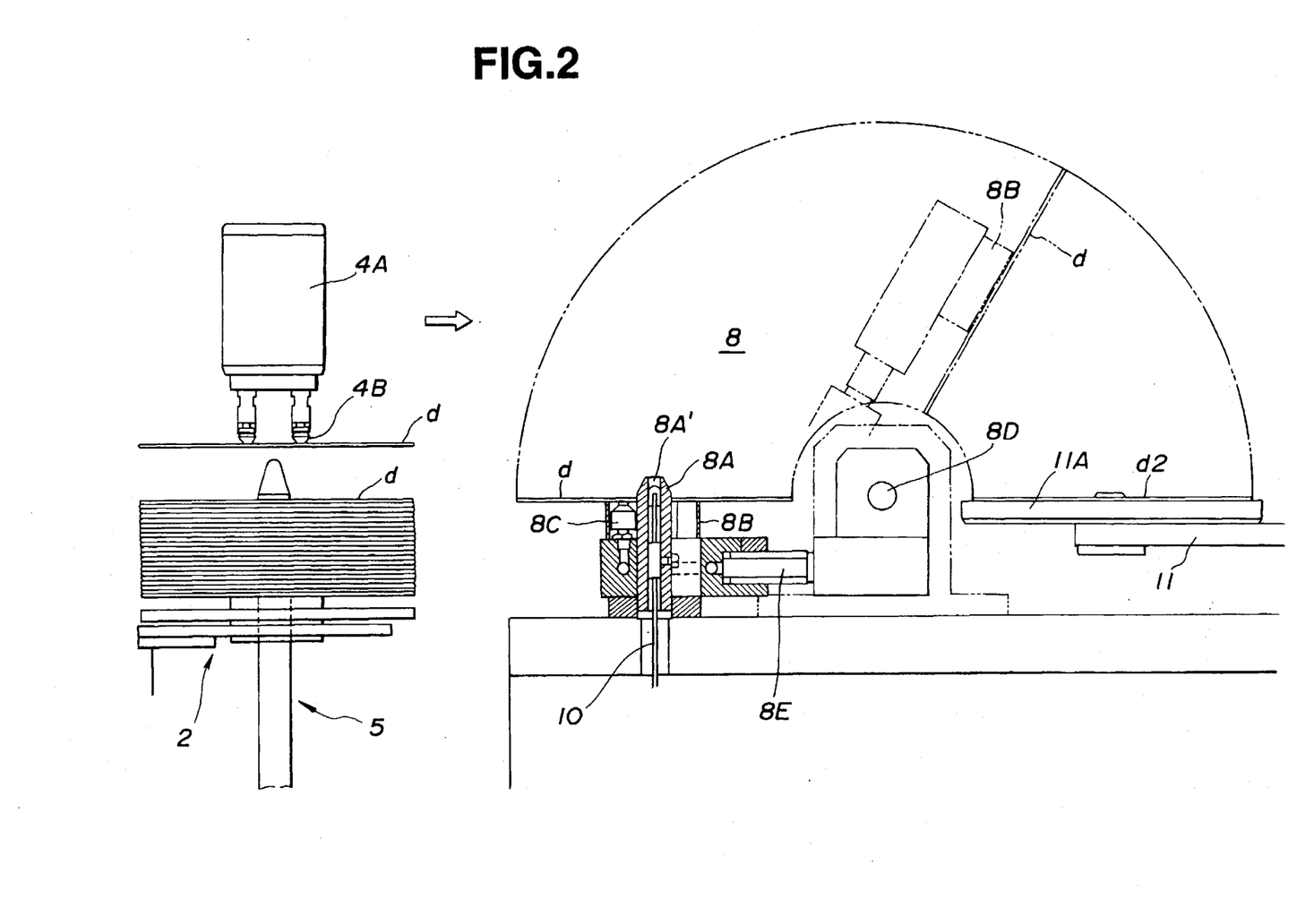
FIG. 2 is a view showing a disk inverting mechanism employed in the disk coating system of FIG. 1.

A disk transfer robot system 4 shown in FIG. 1 is similar to the disk transfer mechanism 7 shown in FIG. 5. However, the disk transfer robot system 4 is capable of performing more complicated motions. The transfer robot system 4 has a swingable robot arm 4A extending to an arm end provided with suction (vacuum) pads 4B for holding a disk by suction, as shown in FIG. 2. In this example, there are provided three or four of the suction pads 4B at the arm end. The transfer robot system 4 swings the arm 4A according to a predetermined program.

An information disk reserving stage 6A and a relay stage 6B are arranged in a circular arc along which the robot arm 4A swings each disk, as shown in FIG. 1. The disk supply position d1 adjacent to the seat lifter 2 is also placed on the circular arc. The disk transfer robot system 4 can transfer each disk from the disk supplying position d1 to the relay stage 6B. In this example, the information disk stage 6A is intermediate between the relay stage 6B and the disk position d1.

A sample disk supply stage 6C for storing sample disks is also placed on the circular arc of the robot arm 4A, as shown in FIG. 1. When a stamper is changed to change the kinds of disks in the system for forming disk substrates, first disks formed by the forming system with a newly changed stamper are checked as sample disks to determine their conformance to quality standards or specifications before the normal production process. These sample disks are placed on the sample disk stage 6C. The sample disk stage 6C is on the opposite side of the disk supplying position d1 to the information stage 6A, so that the disk position d1 is between the information disk stage 6A and the sample disk stage 6C.

A disk inverting mechanism 8 shown in FIG. 1 is arranged to receive each disk from the disk supplying robot system 4 at the relay stage 6B, and to transfer each disk from the relay stage 6B to a predetermined disk receipt position d2 while inverting the disk. The transfer robot system 4 transfers each disk d in the inverted state from the disk supply position d1 to the relay stage 6B, and then the disk inverting mechanism 8 takes up the disk in the inverted state from the relay stage 6B, and places the disk at the disk receipt position d2 in a non-inverted state in which the first disk surface to be coated faces upward and the second disk surface is the underside.

As shown in FIG. 2, the disk inverting mechanism 8 has a hollow center rod (or post) 8A, and a disk holder 8B having suction (vacuum) pads 8C therein. In this example, there are provided three of the suction pads 8C arranged at regular angular intervals of 120°. The center rod 8A is fixed to a stationary base of the disk inverting mechanism 8. The disk holder 8B is connected to a horizontal center shaft 8D by a support rod 8E. In the example shown in FIG. 2, the center shaft 8D is located approximately at the same level as the disk d on the holder 8B at the position shown by solid lines in FIG. 2. The disk supplying robot system 4 takes up one disk from the top of a stack of disks on the stack pole 5 with the suction pads 4B at the end of the robot arm 4A. Then, the supplying robot system 4 moves the robot arm 4A upward, swings the robot arm 4A, and lowers the robot arm 4A at the relay stage 6B so that the upright hollow center rod 8A is inserted into the center hole of the disk held by the robot arm 4A. The disk holder 8B of the inverting mechanism 8 receives and supports this disk from below. The disk holder 8B then holds the disk firmly with the suction pads 8C provided in the holder 8B, rotates with the disk through 180° about the horizontal center shaft 8D so as to invert the disk, and places the disk upside down (in the non-inverted state) on one disk seat on a turntable 11 at the predetermined disk receipt position d2. The suction pads 8C are connected by a suction passage in the inverting mechanism 8 to the center shaft 8D.

Figure 3:
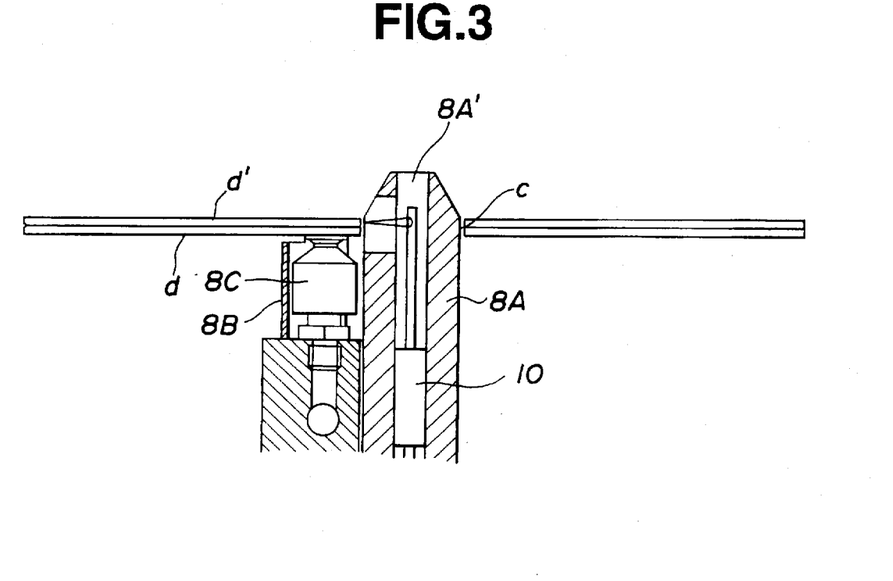
FIG. 3 is a sectional view showing a disk overlap detecting sensor employed in the disk coating system of FIG. 1.

The disk holder 8B of this example is hollow and tubular, and the vicinity of the center rod 8A is hollow on the center shaft 8D's side. That is, the vicinity of the center rod 8A on the right side of the center rod 8A as viewed in FIG. 2 is hollow. Therefore, the disk inverting mechanism 8 can rotate without interfering with the stationary center rod 8A even though the suction pads 8C are placed near the center of a disk as much as possible. When the center shaft 8D is located at the same level as the support rod 8E, the vicinity of the center rod 8A on the side opposite to the center shaft 8D (that is, on the left side of the center rod 8A in FIG. 2) is hollow. Therefore, the disk inverting mechanism 8 can rotate without interfering with the center rod 8A. It is desirable to place the suction pads 8C on the inner (or central) side of a disk, and a consideration must be given to the rotation of the inverting mechanism 8. In this example, therefore, the suction pads 8C are arranged in the disk holder 8B as shown in FIG. 3. In FIG. 3, the right side of the center rod 8A is omitted.

A disk overlap detecting sensor 10 is provided in a hollow portion 8A' of the fixed hollow center rod 8A, and arranged to sense an inside surface defining the center hole of a disk to determine whether there is seated a single disk correctly, or two or more disks are superposed together. The disk overlap detecting sensor 10 is installed fixedly in the stationary hollow rod 8A, as a unit separate from the inverting mechanism 8. Therefore, the sensor 10 does not rotate but remains stationary during the rotation of the inverting mechanism 8. The suction pads 8C sucks a disk near the center of the disk, and the disk overlap detecting sensor 10 senses the central portion of the disk, so that the disk can be held at a predetermined level and the sensor 10 can detect a disk overlap accurately even if the disk is warped.

In an example shown in FIG. 3, two disks d and d' are overlapped and placed together on the disk holder 8B. A reflex type photoelectric sensor is employed as the disk overlap sensor 10. By adjustment of the vertical position and sensitivity, the sensor 10 is arranged not to produce an overlap detection signal when there is only one disk d. The gap between the inside diameter of the center hole of each disk and the outside diameter of the center rod 8A is about 0.1 mm. Therefore, the center positions C of the disks d and d' are determined by the insertion of the center rod 8A into the center holes of the disks. On the other hand, the position of each disk along the up and down direction is determined by the abutment of the disk on the top of the disk holder 8B. This overlap sensor 10 arranged to sense the central portion of a disk instead of the periphery can detect a disk overlap accurately and reliably because the strain of a disk become smaller toward the center of the disk, and each disk has a thickness of 1.2 mm in the inside surface of the center hole.

The disk overlap sensor 10 is in an off state when there is no overlap of disks and only the disk d is detected, and in an on state to produce the disk overlap detection signal when the sensor 10 detects the disk d' overlying the disk d. In response to this overlap detection signal, the coating system stops the operation of the inverting mechanism 8. This overlap detection signal may be further used to produce a warning signal and to allow an operation to remove the superposed disks.

When it is confirmed that a single disk is correctly seated on the disk holder 8B, the disk inverting mechanism 8 grips the disk with the suction pads 8C sucking the underside of the disk, turns the disk upside down, and places the disk on one disk seat 11A on the turntable 11 at the disk receipt position d2.

When disks are stacked in the non-inverted state with the disk surfaces to be coated facing upward, the inversion of disks is not required, and the inverting mechanism 8 is replaced by a disk transfer mechanism. In this case, too, the disk overlap sensor 10 of this example is still applicable and need not be removed.

The turntable 11 receives each disk at the disk receipt position d2 from the disk inverting mechanism 8. The turntable 11 rotates intermittently about its own vertical axis, and thereby carries a disk placed on each disk seat 11A from the disk receipt position d2 to a disk position d3. The information disk reserving stage 6A and the relay stage 6B are located between the first turntable 3 and the second turntable 11.

In this example, there is provided a reflective film forming system 12 for forming an aluminum film, as a reflective film, on the disk surface having a pattern of pits by sputtering or vacuum deposition. A bar-shaped transfer arm 12A has vacuum suction pads at both ends, and transfers a disk from the disk position d3 into a vacuum chamber in the sputtering system 12. At the same time, a disk formed with the reflective film is returned to the position d3 on the turntable 11.

A coating material supplying system 13 is provided near a disk position d4 for supply of a coating material for forming a protective film. The turntable 11 carries each disk formed with the reflective metal film from the disk position d3 for the sputtering operation, to the coating material supplying disk position d4 by the intermittent rotation. The coating material supplying system 13 supplies the coating material onto each disk held at the coating material supplying position d4.

A coating material supplying nozzle 13A of the coating material supplying system 13 according to the embodiment of the present invention is always kept rotating at a constant speed of about 40–120 rpm while the disk coating system 1 is in operation. By rotating the nozzle 13A constantly, this coating material supplying system 13 can reduce the required time for the coating material supplying operation.

Figure 4A:
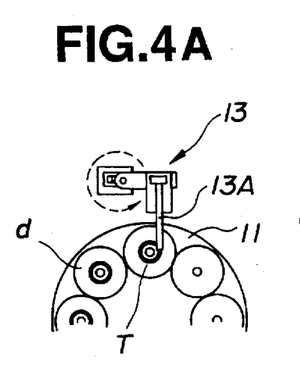
FIGS. 4A, 4B and 4C are views for illustrating a coating material supplying operation of the disk coating system of FIG. 1.
Figure 4B:
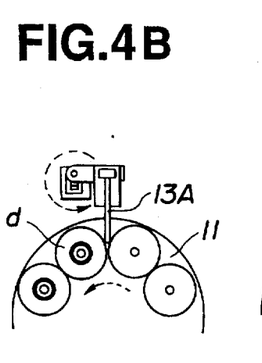
Figure 4C:
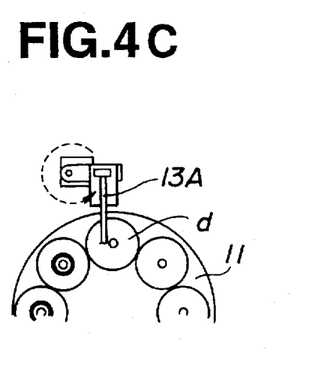

The coating material supplying nozzle 13A supplies the coating material on a disk at the disk position d4 while the nozzle 13A is rotated approximately one round about the axis of the disk. Therefore, as shown in FIG. 4A, there is formed, on the disk surface, a ring-shaped thick film T of the liquid coating material around the center hole of the disk. Then, the turntable 11 starts rotating about the axis of the turntable 11 to shift the disks on the turntable 11 to the respective next positions. During this rotational movement of the turntable 11, the coating material supplying nozzle 13A remains rotating at the constant speed as shown in FIG. 4B. The nozzle 13A continues rotating in this way, and the next disk reaches the coating material supplying position d4 as shown in FIG. 4C. The nozzle 13A starts dripping the coating material immediately when the turntable 11 stops rotating to hold the next disk at the coating material supplying position d4. Because the nozzle 13A is constantly held in the rotating state, the coating material supplying system 13 according to the embodiment can immediately supply the coating material to the disk on the instant of stoppage of the turntable 11 without delay. The coating material supplying system 13 stops the supply of the coating material when a ring of the coating material is formed on the disk surface, and repeats these operations shown in FIGS. 4A, 4B and 4C while maintaining the constant rotation of the nozzle 13A. In this example, a member for driving the nozzle 13A rotates as shown by a dot line arrow in FIGS. 4A, 4B and 4C, and the end of the nozzle 13A rotates about the center of a disk at the position d4.

The coating system of this example has a function for starting the supply of the coating material immediately when the turntable 11 stops to hold a disk at the position d4, a function for terminating the supply of the coating material at the end of a predetermined angular rotation (about 360°) of the nozzle 13A, and a function for restarting the rotation of the turntable immediately after the termination of the supply of the coating material. On the other hand, the system of this example can eliminate a function to start the rotation of the nozzle 13A after stoppage of the turntable 11, a function for waiting until a time for stabilizing the rotation of the nozzle 13A elapses, and a function for stopping the rotation of the nozzle 13A after the supply of the coating material for one disk is finished and the nozzle 13A is returned to an original position. In this example, each of the turntable 11 and the coating material supplying system 13 is mechanically linked with a main shaft of the coating system through a mechanism such as a cam mechanism. When a main switch is turned on, the main shaft starts rotation. At the same time, the turntable 11 starts the intermittent rotation, and the nozzle 13A also starts its rotation. The coating material supply system 13 of this example is mechanically connected with the main shaft so that rotation is always transmitted from the main shaft to the coating material supplying system 13. The coating material supplying system 13 is further arranged mechanically to start the supply of the coating material in synchronism with stoppage of the intermittent rotation of the turntable 11, and to terminate the supply of the coating material at the end of a predetermined angular rotation.

Figure 4D:
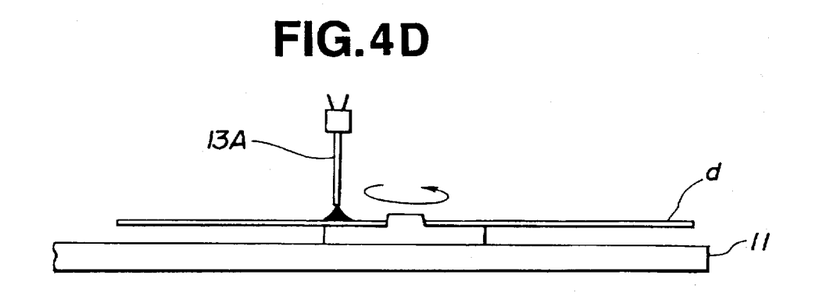
FIG. 4D is a view for showing a coating material supplying nozzle and a disk seat on a turntable of the coating system of FIG. 1.

Each disk seat on the turntable 11 has a center projection to be inserted in the center hole of a disk as shown in FIG. 4D. In this example, the height of the center projection of each disk seat is lower than the height of the lowest end of the nozzle 13A so that the disk seat on the turntable 11 can rotate about the axis of the turntable 11 without interfering with the nozzle 13A kept rotating.

After the coating material supplying operation at the disk position d4, a disk is carried forward from the coating material supplying position d4 by the turntable 11, and a disk is set at a disk removal position d5 in each single angular movement of the intermittent rotation of the turntable 11.

In this disk coating system 1 according to this embodiment, at least the turntable 11 and the coating material supplying system 13 constitute a first process section of the coating system, and a second process section is constituted at least by a spinning system.

A pair of spinners 17 and 17' is main components of the spinning system. The first and second spinners 17 and 17' of a conventional type are placed near the disk removal position d5 on the turntable in the following manner. The centers of spin portions of the first and second spinners 17 and 17' are equally distant from the center of a disk resting at the disk removal position d5 so that these three centers form an isosceles triangle, and the center of the disk at the disk removal position d5 is at the apex of this isosceles triangle. In this example, the centers of the spin portions of the first and second spinners 17 and 17' correspond to later-mentioned first and second disk spinning positions.

A first disk transfer mechanism 15 is provided between the first and second spinners 17 and 17'. The disk transfer mechanism 15 has a pair of transfer arms 15a and 15b which are connected with a single common drive unit (or drive source) so that the first and second transfer arms 15a and 15b are capable of performing up and down motion and swing motion. The first and second arms 15a and 15b are equal in length to each other, and both arms 15a and 15b are relatively short. In this example, the first and second transfer arms 15a and 15b are fixedly mounted on a swingable common base so that both arms move as a unit. The first transfer arm 15a has a suction (or vacuum) portion for holding one disk at a first disk holding point. Similarly, the second transfer arm 15b has a suction portion for holding one disk at a second disk holding point. Instead of these suction portions, it is possible to use mechanical chucks that hold the edge of the center hole of a disk. The first and second transfer arms 15a and 15b swivel about a vertical first common swing axis to transfer disks one by one from the disk removal position d5 on the turntable 11 to either of the first and second spinners 17 and 17'. As the transfer arms 15a and 15b swivel about the first common swing axis, the center of a disk held at the first or second disk holding point by each transfer arm 15a or 15b describes an arc of a first imaginary circle on which all the three vertices of the above-mentioned isosceles triangle lie. On the first circle, the disk removal position d5 is middle between the first and second disk spinning positions of the spinners 17 and 17'. That is, the length of the circular arc between the disk removal position d5 and the first disk spinning position is equal to the length of the circular arc between the disk removal position d5 and the second spinning position. The length of the circular arc between the center of a disk held at the first disk holding point by the first transfer arm 15a and the center of a disk held at the second disk holding point by the second transfer arm 15b is equal to the length of the two equal arcs extending from the disk removal position d5 in the opposite directions to the first and second spinning positions.

The transfer arms 15a and 15b are driven by the single common drive unit to swing between a first swing state and a second swing state. In the first swing state, the first transfer arm 15a is at an angular position to hold a disk at the first disk spinning position of the first spinner 17, and at the same time the second transfer arm 15b is at an angular position to hold a disk at the disk removal position d5. Therefore, the transfer mechanism 15 can take up a disk at the disk removal position d5 with the second transfer arm 15b, and simultaneously put down a disk in the first spinner 17 with the first transfer arm 15a. In the second swing state, the second transfer arm 15b is at the angular position to hold a disk at the second spinning position of the second spinner 17', and at the same time the first transfer arm 15a is at an angular position to hold a disk at the disk removal position d5. Therefore, the transfer mechanism 15 can take up a disk at the disk removal position d5 with the first transfer arm 15a, and simultaneously put down a disk in the second spinner 17' with the second transfer arm 15b. By swinging between the first and second swing states as shown in dot line arrows in FIG. 1, the transfer mechanism 15 can transfer disks from the disk removal position d5 alternately to the first and second spinners 17 and 17'. This alternating operation increases the operating speed of the transfer mechanism 15, and reduces the degree of undesired deformation of the ring of the coating material dripped on the disk surface. This transfer mechanism 15 helps produce high quality liquid thin films on disks.

A coating curing system (or third process section) 21 has a third turntable 25 for carrying each disk from a disk receipt position d6 to a disk removal position d7 by intermittently rotating. The disk receipt position d6 is equidistant from the centers of the spin portions of the first and second spinners 17 and 17', and accordingly the disk receipt position d6 is located at the apex of an isosceles triangle formed by the first and second disk spinning positions of the first and second spinners 17 and 17' and the disk receipt position d6.

A second disk transfer mechanism 19 is provided between the spinning system (or the second process section) and the curing system 21 (or the third process section). The disk transfer mechanism 19 has a pair of transfer arms 19a and 19b which are connected with a single common drive unit (or drive source). The first and second transfer arms 19a and 19b are driven by the common drive unit, and arranged to perform up and down motion and swing motion, like the transfer arms 15a and 15b of the first transfer mechanism. The first and second transfer arms 19a and 19b are equal in length to each other, and both arms 19a and 19b are relatively long. In this example, the first and second transfer arms 19a and 19b are fixedly mounted on a swingable common base so that both arms move as a unit. The first and second transfer arm 19a and 19b have suction (or vacuum) portions (or mechanical chucks) for holding disks at third and fourth disk holding points, respectively, and swivel about a second vertical single common swing axis to transfer disks from the first and second spinning positions in the first and second spinners 17 and 17' to the disk receipt position d6 on the third turntable 25. As the transfer arms 19a and 19b swing about the second common swing axis, the center of a disk held at the third or fourth disk holding point by each transfer arm 19a or 19b describes an arc of a second imaginary circle on which all the three vertices of the isosceles triangle formed by the disk receipt position d6 and the first and second spinning positions of the first and second spinners 17 and 17' lie. In this second circle, the length of the arc between the first spin position and the disk receipt position d6 is equal to the length of the arc between the second spin position and the disk receipt position d6. The length of the circular arc between the third disk holding point at which the center of a disk is held by the first transfer arm 19a and the fourth disk holding point at which the center of a disk is held by the second transfer arm 19b is equal to the length of these two equal arcs extending from the disk receipt position d6 in the opposite directions to the first and second spin positions in the first and second spinners 17 and 17'. The transfer mechanism 19 transfers disks to the disk receipt position d6 on the third turntable 25 alternately from the first and second spinners 17 and 17' by swinging back and forth as shown by dot line arrows in FIG. 1, The transfer arms 19a and 19b of the second transfer mechanism 19 are longer than the transfer arms 15a and 15b of the first transfer mechanism 15. Furthermore, the angle formed between the transfer arms 19a and 19b of the second transfer mechanism 19 is greater than the angle formed between the transfer arms 15a and 15b of the first transfer mechanism 15. The transfer arms 15a and 15b of the first transfer mechanism 15 are designed to transfer disks to the spinners 17 and 17' as quickly as possible in order to reduce undesired influence of delay on the ring-shaped film of the coating material. Instead, the circumferential distance and angular displacement each transfer arm 19a or 19b of the second transfer mechanism 19 must travel are increased because the influence of delay is not so problematical after the spinning operation.

A coating curing apparatus 23 is provided in the curing system (third process section) 21. In this example, the curing apparatus 23 hardens the coating on each disk by irradiating ultraviolet light. Each disk placed at the disk receipt position d6 on the turntable 25 is passed through the curing apparatus 23 while the turntable 25 is rotated intermittently. The thin film of the coating material on each disk is exposed to the ultraviolet radiation in the curing apparatus 23, and completed into a thin hard film. After the operation of the apparatus 23, each disk reaches the disk removal position d7 on the turntable 25.

A third disk transfer mechanism 28 transfers disks one after another from the disk removal position d7 on the turntable 25 to a disk inspection system 35. The third disk transfer mechanism 28 is constructed in the same manner as the first and second disk transfer mechanisms 15 and 19. The inspection system 35 performs various inspecting operations as disclosed in Japanese Patent Provisional Publication No. 6-139624. After the inspection, the transfer mechanism 28 transfers each disk to an accept/reject discriminating position d10, and places each disk on a stand 39 at the discriminating position d10.

There is further provided a single arm transfer mechanism 37 used for cooling disks. Disks formed by the injection molding are hot. Therefore, disks reaching the disk inspection system 35 are not yet cooled enough because of a high speed operation in the disk coating system of this embodiment, so that the accuracy of inspection becomes poor in some inspecting operations affected by the disk temperature. Therefore, prior to these inspecting operations, the transfer mechanism 37 transfers, with its single transfer arm, a disk from an inspection position d8 to a cooling position d9. After a predetermined cooling time, the single arm of the transfer mechanism 37 returns the disk from the cooling position d9 to the inspection position d8 for inspection.

A disk discharging robot system 30 having a single transfer arm transfers each disk from the accept/reject discriminating position d10 to either a fourth turntable 31 for acceptable disks or a turntable 41 for unacceptable disks, in response to a judgment signal from the disk inspection system 35. If the judgment signal indicates that a disk is unacceptable, then the discharging robot 30 takes up the disk by suction, swivels in the clockwise direction as viewed in FIG. 1, and puts down the disk on a stack pole 43 on the rejection turntable 41. When a disk is judged acceptable, the discharging robot 30 swivels in the counterclockwise direction to a disk position d11 on the acceptance turntable 31, and there automatically places the disk on a stack pole 45 preliminarily mounted by a human operator on the acceptance turntable 31. When a predetermined number of acceptable disks are stacked on the stack pole 45 at the position d11, the turntable 31 rotates through a predetermined angle, and brings a next empty stack pole 45 to the disk position d11. The full stack pole 45 is replaced by another empty stack pole 45. The disk coating system 1 repeats these operations for ordinary disks.

The before-mentioned information disk is treated differently from ordinary disks. The information disk is a special disk for production control. The lot number and data indicating the contents of disks are printed on the information disk. The information disk is required to be placed on top of a stack of ordinary disks on one stack pole 45, but the operation for forming a metal film, the coating operation and the inspecting operation are not necessary.

First, the information disk on top of a disk stack on the stack pole 5 at the disk position d1 on the first turntable 3 is set aside on the information disk stage 6A by the supply robot system 4. The information disk remains on the information disk stage 6A while the ordinary disks are removed from the stack pole unit 5 at the disk position d1. After handing the lowermost disk of the stack to the disk inverting mechanism 8, the transfer robot system 4 turns to the information disk stage 6A instead of returning to the disk position d1, lifts up the information disk by sucking, and hands over the information disk to the disk inverting mechanism 8.

When the transfer robot system 4 performs this special operation for the information disk, the disk coating system 1 interrupts all the film forming operation of the sputtering system 12, the coating material supplying operation of the supplier 13, the spinning operation of the spinners 17 and 17' and the inspecting operation of the inspection system 35. Therefore, the information disk is only transported, without experiencing these operations, to the disk position d11 on the turntable 31, and placed on the uppermost disk of the stack of the stack pole unit 45. The coating system 1 is programmed to handle the information disk in this manner. After receiving the information disk on top of the stack at the disk position d11, the turntable 31 rotates through a predetermined angle, and places the next empty stack pole 45 at the position d11.

In this example, the information disk stage 6A is placed at the side of the turntable 3 on the disk supplying side (input side). However, it is optional to provide an information disk stage 6A', near the turntable 31 on the disk discharging side (output side), at a position on a circular arc along which the end of the arm of the disk discharging robot 30 swings. In this case, the coating system recognizes the uppermost disk on the stack pole 5 on the first turntable 3 as the information disk, and conveys the disk supplied first and foremost from the stack pole 5 without performing the operations unnecessary to the information disk. The discharging robot system 30 regards the first arrival as the information disk and places it on the information disk stage 6A' on the discharge side. The information disk waits on the information disk stage on the discharge side until all the disks of the stack on the stack pole 5 on the first turntable 3 arrive at the disk position d11 on the turntable 31. When the last disk coming from the lowermost layer of the stack at the disk supply position d1 is placed on the top of the stack at the disk position d11, the disk discharging robot system 30 picks up the information disk on the information disk stage on the discharge side and placed the information disk on the uppermost disk of the stack at the position d11. The above-mentioned operations for the information disk can be performed in various coating systems such as the conventional coating system shown in FIG. 5 or a system having only one spinner.

The coating system of this example discriminates the uppermost disk and the lowermost disk of a stack of disks on a stack pole from intermediate disks between the uppermost and lowermost disks. When the turntable 3 brings a new stack of disks on one of the stack poles to the disk position d1, the coating system recognizes the disk which is first gripped by the disk supplying robot system 4, as the uppermost disk. If, immediately after a removal of a disk from the disk stack, the coating system detects the arrival of the disk lifter 2 at its upper limit position and the nonexistence of a remaining disk in the stack pole, then the coating system recognizes that disk most recently removed, as the lowermost disk. Disks between the disk recognized as the uppermost disk and the disk recognized as the lowermost disk are all considered to be intermediate disks.

At the instant when a disk is removed from one disk position to transfer the disk from that position to a next position in the coating system, a disk transfer indicating signal (a kind of flag) is produced to indicate the transfer of a disk to the next position. When the disk arrives at the next position, a disk detecting sensor detects the existence of the disk at the next position. The coating system collates the transfer indicating signal and the signal of the disk detecting sensor, and if agreement is confirmed, produces a disk existence signal (or flag) indicating the existence of a disk at the next position.

As the disk is transferred to subsequent positions sequentially, this disk existence signal is also sent to the subsequent positions so that the existence of a disk at each position is recognized.

In this way, each intermediate disk is transferred with the disk existence indicating signal. For the uppermost and lowermost disks, the coating system sends not only the disk existence signal but also a signal (or flag) indicating the uppermost or lowermost disk. Therefore, the uppermost or lowermost disk is transferred together with the disk existence signal and the signal identifying the uppermost or lowermost disk.

In this example, the information disk is the uppermost disk. Therefore, the information disk is transferred with the signal indicating the uppermost disk. By using this signal, the coating system can recognize the information disk at each of the positions where the recognition of the information disk is required, and treat the information disk differently from the other ordinary disks.

The before-mentioned sample disks are treated in the following manner. A predetermined number of sample disks (normally about 5–10 disks) are placed by a human operator on the sample disk supply stage 6C. After the exchange of stampers, as mentioned before, first disks produced by the injection molding system are used as sample disks for determine their conformance to quality standards. These sample disks are checked before the normal production process. Therefore, the urgent check of sample disks are often required in the middle of the normal operation dealing with disks mounted on the stack pole 5 at the disk supply position d1.

In this case, the coating system 1 interrupts the operation for supplying disks from the stack pole 5 at the disk supply position d1 in response to an on signal from a switch 61 (shown in FIG. 7) to start operations for sample disks. Namely, the disk supplying robot system 4 stops transferring disks from the disk supply position d1 and instead start delivering the sample disks one by one from the sample disk stage 6C to the inverting mechanism 8 when a human operator pushes a button to start the operation for sample disks. Each sample disk undergoes the same operations as ordinary disks, and finally the discharging robot 30 places each sample disk on a sample disk discharge stage 47 if it is judged acceptable, and on the stack pole 43 if it is unacceptable. In this case, the discharging robot system 30 automatically discriminates sample disks from ordinary disks and selects the sample disk discharge stage 47 as the destination in accordance with the timing of the operation which the supplying robot system 4 performs to supply sample disks from the sample disk supply stage 4C.

When all the sample disks are transferred from the sample disk supply stage 6C, the coating system automatically resumes the normal coating operations for ordinary disks, and the disk supplying robot system 4 restarts delivering ordinary disks from the stack at the disk supply position d1 to the disk inverting mechanism 8. Disks are supplied to the second turntable 11 continuously without interruption so that every disk seat on the turntable 11 receives one disk at the disk receipt position d2. The above-mentioned operations for sample disks can be performed in various coating systems such as the conventional coating system shown in FIG. 5 or a system having only one spinner.

When the button of the switch 61 to start the operation for sample disks is pushed, the disk supplying robot system 4 is switched from a normal operating mode to transfer disks from the disk supply position d1 to the disk inverting mechanism 8 to a sample disk operating mode to transfer disks from the sample disk supply stage 6C to the inverting mechanism 8. When the robot system 4 takes up a disk from the sample disk supply stage 6C, a signal (or flag) indicating the sample disk is delivered together with the signal indicating the existence of a disk. Therefore, the coating system transfers each sample disk accompanied by the signal indicating that this disk is a sample disk. Therefore, the disk discharging robot system 30 can recognize a sample disk by checking the signal accompanying the disk. In this example, there is provided, in the sample disk supply stage 6C, a disk detecting sensor 62 (shown in FIG. 7) for sensing a disk on the sample disk supply stage 6C. When all the sample disks are removed from the sample disk supply stage 6C, this sensor detects that there are no disks on the stage 6C, and produces a signal indicating the emptiness on the stage 6C. In response to this signal, the disk supplying robot system 4 is automatically switched from the sample disk operating mode to the normal operating mode.

Figure 7:
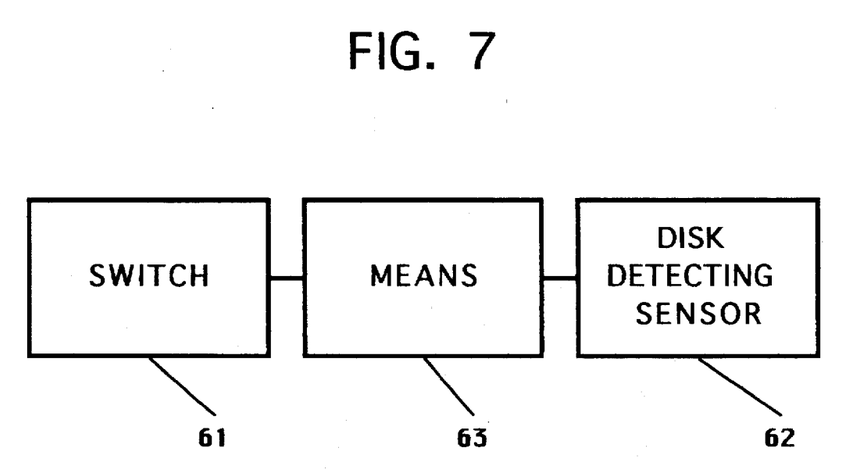
FIG. 7 is a block diagram showing an arrangement for switching a disk supplying robot system 4 shown in FIG. 1 between a normal operating mode and a sample disk operating mode.

In the illustrated example, the first turntable 3, robot system 4 and inverting mechanism 8 are main components of a disk supplying section for supplying disks to the first process section (11, 12, 13 etc.). The robot system 4 and inverting mechanism 8 cooperate to serve as a disk transfer system for delivering disks one by one from the stack pole 5 to the first process section. As shown in FIG. 7, the disk supplying robot system 4 of this example comprises a means 63 for switching the robot system 4 from the normal operating mode to the sample disk operating mode in response to the signal of the switch 61. The means 63 causes the robot system 4 to resume the normal operating mode in response to the signal of the disk detecting sensor 62. In an alternative example, the switch 61 has a first switch state for producing the signal to start the operating of the sample disk operating mode and a second switch state for producing a signal to resume the operation of the normal operating mode.

In the example shown in FIGS. 4A, 4B and 4C, the coating material supplying nozzle 13A is rotated at the predetermined constant speed. However, it is optional to provide a small motor for each disk seat on the second turntable 11, and rotate each disk seat at a constant speed with the motor.

As explained above, the coating system according to the embodiment of the present invention employs the first and second disk transfer mechanisms 15 and 19 each of which is arranged to transfer disks to or from the two spinners 17 and 17' by using both transfer arms 15a and 15b or 19a and 19b simultaneously. Therefore, this embodiment can simplify the transfer mechanisms, reduce the sizes of the transfer mechanisms, increases the rate of the disk transferring operations, decreases the production cost, and improve the coating quality.

The coating material supply system 13 according to this embodiment is arranged to maintain the rotation of the nozzle 13A constantly, so that the supply of the coating material can be started immediately when a disk reaches the supply position d4. This embodiment can thus improve the uniformity of the coating and increases the speed of the coating operation.

The coating system according to the embodiment can treat each information disk automatically without the need for manually setting aside an information disk and manually placing an information disk on a stack of disks on the discharge side.

The coating system according to the embodiment can deal with sample disks quickly by interrupting the normal operation for ordinary disks, and sort out sample disks.

The coating system according to the embodiment employs the disk inverting system 8, so that disks can be stacked in the inverted state for protection against dust.

The disk overlap detecting system according to this embodiment is arranged to detect an overlap of disks from the center hole of a disk. This detection from the center is accurate because the central part of a disk is less susceptible to warp and strain. Therefore, this system can avoid waist of disks and time.

What is claimed is:

1. A disk coating system comprising:
    a first process section which comprises a turntable for carrying a plurality of disks sequentially from a predetermined coating material supply position to a predetermined disk removal position by intermittently rotating, and a coating material supplying apparatus for supplying a coating material to each disk held at the coating material supply position by said turntable;
    a second process section for spinning each disk to remove an excess amount of the coating material;
    a third process section for receiving each disk from said second process section and for curing a coating layer on each disk;
    a first disk transfer mechanism for transferring each disk from said removal position on said turntable of said first process section to said second process section; and
    a second disk transfer mechanism for transferring each disk from said second process section to said third process section;
    wherein said second process section comprises first and second spinners spaced substantially equidistantly from said removal position of said first process section so as to form an imaginary isosceles triangle; and
    wherein said first disk transfer mechanism comprises first and second transfer arms for transferring disks from said removal position alternately to said first and second spinners.

2. A disk coating system according to claim 1 wherein said third process section comprises a curing apparatus for curing the coating layer on each disk and a turntable for carrying each disk from a predetermined disk receipt position of said third process section to said curing apparatus, said receipt position of said third process section is substantially equidistant from said first and second spinners of said second process section so as to form an imaginary isosceles triangle, and said second disk transfer mechanism comprises first and second transfer arms for transferring disks alternately from said first and second spinners to said receipt position of said third process section.

3. A disk coating system according to claim 2 wherein said first and second transfer arms of said first transfer mechanism form a first angle, said first and second transfer arms of said second transfer mechanism form a second angle, said first angle is smaller than said second angle, and said transfer arms of said first disk transfer mechanism are shorter than said transfer arms of said second transfer mechanism.

4. A disk coating system according to claim 2:
    wherein said first transfer arm of said first disk transfer mechanism comprises a disk holding means for holding a disk at a first disk holding point, said second transfer arm of said first disk transfer mechanism comprising a disk holding means for holding a disk at a second disk holding point, said first and second disk holding points of said first and second transfer arms are substantially equidistant from a predetermined first common swing axis, and said first and second transfer arms of said first disk transfer mechanism are swingable on said first common swing axis so that said first and second disk holding points are rotatable on an imaginary first circle with a center lying on said first common swing axis;
    wherein said first transfer arm of said second disk transfer mechanism comprises a disk holding means for holding a disk at a third disk holding point, said second transfer arm of said second disk transfer mechanism comprises a disk holding means for holding a disk at a fourth disk holding point, said third and fourth disk holding points of said first and second transfer arms of said second disk transfer mechanism are substantially equidistant from a predetermined second common swing axis, and said first and second transfer arms of said second disk transfer mechanism are swingable on said second common swing axis so that said third and fourth disk holding points are rotatable on an imaginary second circle with a center lying on said second common swing axis; and
    wherein said first circle is smaller in diameter than said second circle, and an angle subtended at the center of the first circle by an arc of the first circle between said first and second disk holding points is smaller than an angle subtended at the center of the second circle by an arc of the second circle between said third and fourth disk holding points.

5. A disk coating system according to claim 4 wherein said first and second transfer arms of said first disk transfer mechanism are swingable, as a unit, on said first common swing axis between a first swing state in which said first transfer arm is at a first angular arm position for holding a disk at a predetermined first spin position in said first spinner and said second transfer arm is at a middle angular arm position for holding a disk at said removal position of said first process section, and a second swing state in which said first transfer arm is at said middle angular arm position for holding a disk at said removal position of said first process section and said second transfer arm is at a second angular arm position for holding a disk at a predetermined second spin position in said second spinner, and said first and second spin positions of said first and second spinners are equally distant from said disk removal position of said first process section.

6. A disk coating system according to claim 5 wherein said first and second transfer arms of said second disk transfer mechanism are swingable, as a unit, on said second common swing axis between a first swing state in which said first transfer arm of said second transfer mechanism is at a first angular arm position for holding a disk at said predetermined first spin position in said first spinner and said second transfer arm is at a middle angular arm position for holding a disk at said receipt position of said third process section, and a second swing state in which said first transfer arm is at said middle angular arm position for holding a disk at said receipt position of said third process section and said second transfer arm is at a second angular arm position for holding a disk at said predetermined second spin position in said second spinner said first and second spin positions of said first and second spinners are equally distant from said disk receipt position of said third process section, and said angle subtended at the center of the second circle by an arc of the second circle between said third and fourth disk holding points is smaller than 180°.

7. A disk coating system according to claim 4 wherein said coating material supplying apparatus comprises a coating material supplying nozzle which is kept rotating at a constant speed irrespective of whether said first process section is in a first state in which said turntable of said first process section is in a rotational motion or in a second state in which said supply nozzle supplies the coating material onto a disk held stationary at said coating material supply position by said turntable of said first process section.

8. A disk coating system according to claim 4 wherein said turntable of said first process section comprises a plurality of disk seats each for rotating a disk at a constant speed both when the disk is moved to said coating material supply position by a rotational movement of said turntable of said first process section and when the disk is held stationary at said coating material supply position by said turntable of said first process section and supplied with the coating material from said coating material supplying apparatus at said coating material supply position.

9. A disk coating system according to claim 4 wherein said disk coating system further comprises a disk supplying section for supplying disks to said first process section; said disk supplying section comprises a stack pole for storing a stack of disks, a disk reserving stage for reserving at least one disk, and a disk transfer system for delivering disks one by one from said stack pole to said first process section; said disk transfer system is arranged to transfer an uppermost disk of the stack to said disk reserving stage and deliver said uppermost disk from said disk reserving stage to said first process section after a lowermost disk of the stack is delivered to said first process section; and said coating system is arranged to convey the uppermost disk without forming a coating layer on the uppermost disk.

10. A disk coating system according to claim 4 wherein said disk coating system further comprises a disk supplying section for supplying disks to said first process section; said disk supplying section comprises a stack pole for storing a stack of disks; said coating system is arranged to convey an uppermost disk of the stack without forming a coating layer on the uppermost disk; said disk coating system further comprises a disk discharging section for receiving disks from said third process section; said disk discharging section comprises a stack pole for storing disks in a stack, a disk reserving stage for reserving at least one disk, and a disk transfer system for placing the uppermost disk of the stack pole of said disk supplying section on said disk reserving stage and shifting the uppermost disk from said disk reserving stage to said stack pole of said disk discharging section after a lowermost disk of the stack on the stack pole of said disk supplying section is placed on said stack pole of said disk discharging section.

11. A disk coating system according to claim 9 wherein said uppermost disk of the stack of said stack pole of said disk supplying section is an information disk for indicating information items for production management so that no coating layer is formed on the information disk.

12. A disk coating system according to claim 4 wherein said disk coating system further comprises a disk supplying section for supplying disks to said first process section; said disk supplying section comprises a stack pole for storing a stack of disks, and a sample disk supply stage for reserving a sample disk, and a disk transfer system for delivering disks one by one from said stack pole to said first process section; said disk transfer system of said disk supplying section is connected with a switch; and said disk transfer system of said disk supplying section comprises a means for interrupting a normal transfer operation to transfer disks from said stack pole of said disk supplying section to said first process section in response to a signal from said switch, instead transferring the sample disk from said sample disk supply stage to said first process section, and resuming said normal transfer operation after supply of the sample disk.

13. A disk coating system acceding to claim 12 wherein said disk supplying section further comprises a disk detecting sensor for sensing a disk on the sample disk supply stage and producing an emptiness indicating signal when there are no disks on the sample disk supply stage, and said disk transfer system of said disk supplying section is arranged to resume said normal transfer operation automatically in response to said emptiness indicating signal.

14. A disk coating system acceding to claim 12 wherein said switch comprises a first switch state to produce a first switch signal to interrupt the normal transfer operation and instead start a sample disk transfer operation, and a second switch state to produce a second switch signal to resume the normal transfer operation, and said disk transfer system of said disk supplying section is arranged to resume said normal transfer operation in response to said second switch signal.

15. A disk coating system according to claim 4 wherein said disk coating system further comprises a disk supplying section for supplying disks one by one to said first process section, and said disk supplying section comprises a disk inverting system for holding each disk by suction, inverting each disk and placing each disk in an inverted state on said turntable of said first process section.

16. A disk coating system according to claim 4 wherein said disk coating system further comprises a disk supplying section for supplying disks one by one to said first process section, said disk supplying section comprises a disk overlap detecting sensor for sensing a thickness of a disk in a center hole of the disk to detect an overlap of disks, and said disk overlap detecting sensor comprises a sensing portion installed in an upright hollow shaft for fitting in the center hole of a disk.

17. A disk coating system comprising:

a first process section which comprises a turntable for carrying a plurality of disks sequentially from a predetermined coating material supply position to a predetermined disk removal position by intermittently rotating, and a coating material supplying apparatus for supplying a coating material to each disk held at the coating material supply position by said turntable;

a second process section for spinning each disk to remove an excess amount of the coating material;

a third process section for receiving each disk from said second process section and for curing a coating layer on each disk;

a first disk transfer mechanism for transferring each disk from said removal position on said turntable of said first process section to said second process section; and a second disk transfer mechanism for transferring each disk from said second process section to said third process section;

wherein said third process section comprises a curing apparatus for curing the coating layer on each disk and a turntable for carrying each disk from a predetermined disk receipt position to said curing apparatus;

wherein said second process section comprises first and second spinners spaced substantially equidistantly from said receipt position of said third process section so as to form an imaginary isosceles triangle; and wherein said second disk transfer mechanism comprises first and second transfer arms for transferring disks alternately from said first and second spinners to said receipt position of said third process section.

* * * * *